(12) United States Patent
Easwaran

(10) Patent No.: US 7,256,635 B2
(45) Date of Patent: Aug. 14, 2007

(54) LOW LOCK TIME DELAY LOCKED LOOPS USING TIME CYCLE SUPPRESSOR

(75) Inventor: Sri Navaneethakrishnan Easwaran, Zurich (CH)

(73) Assignee: NXP B.V., Eindhoven (NL)

( * ) Notice: Subject to any disclaimer, the term of this patent is extended or adjusted under 35 U.S.C. 154(b) by 146 days.

(21) Appl. No.: 10/538,375

(22) PCT Filed: Dec. 9, 2003

(86) PCT No.: PCT/IB03/05810

§ 371 (c)(1),
(2), (4) Date: Jun. 13, 2005

(87) PCT Pub. No.: WO2004/055989

PCT Pub. Date: Jul. 1, 2004

(65) Prior Publication Data

US 2006/0103440 A1    May 18, 2006

(51) Int. Cl.
*H03H 11/26* (2006.01)
(52) U.S. Cl. .................. 327/261; 327/299

(58) Field of Classification Search .................. None
See application file for complete search history.

(56) References Cited

U.S. PATENT DOCUMENTS

| | | | | | |
|---|---|---|---|---|---|
| 4,973,860 | A | * | 11/1990 | Ludwig | 327/145 |
| 5,001,374 | A | * | 3/1991 | Chang | 327/552 |
| 5,103,192 | A | * | 4/1992 | Sekine et al. | 331/1 A |
| 5,300,820 | A | * | 4/1994 | Sayama et al. | 327/165 |
| 5,463,655 | A | * | 10/1995 | Llewellyn | 375/359 |
| 5,623,223 | A | * | 4/1997 | Pasqualini | 327/298 |
| 5,666,388 | A | * | 9/1997 | Neron | 375/376 |
| 6,088,255 | A | * | 7/2000 | Matsuzaki et al. | 365/76 |
| 6,417,705 | B1 | * | 7/2002 | Tursi et al. | 327/158 |
| 6,593,787 | B2 | * | 7/2003 | Kouzuma | 327/159 |
| 6,701,445 | B1 | * | 3/2004 | Majos | 713/500 |

* cited by examiner

*Primary Examiner*—Cassandra Cox

(57) ABSTRACT

The invention discloses a delay locked loop (DLL) architecture with a time cycle suppressor circuit suitable for use with synchronous integrated circuits containing a clock generator. Utilization of the improved delay locked loop architecture with a time cycle suppressor circuit disclosed herein enables reduction in the lock time of the synchronous circuit.

12 Claims, 8 Drawing Sheets

LOW LOCK TIME DELAY LOCKED LOOPS USING TIME CYCLE SUPPRESSOR

The invention relates generally to a method and apparatus for a delay locked loop (DLL) circuit architecture with a time cycle suppressor circuit by which the lock time can be reduced.

A delay locked loop is an electronic circuit which can be used to match the internal clock of a synchronous integrated circuit device with an external clock, without error, i.e., to reduce so-called clock skew. By controlling the time delay of the internal clock relative to the external clock, the internal clock can be synchronized with the external clock. One important performance parameter of a delay locked loop is the lock time, or the time required for this synchronization to occur. In existing DLLs, the internal clock signal is passed directly on to a phase frequency detector. This approach makes the phase error very large, which increases the resultant lock time.

Accordingly, there exists a need for an alternative DLL circuit architecture which provides for reduced lock time.

It is therefore a feature of the present invention to overcome the above shortcomings related to DLL circuit architecture by providing a method and apparatus for a time cycle suppressor logic circuit which provides reduced lock times. Such DLL circuit architecture lock time circuits may be found in, inter alia, semiconductor devices which include a synchronous memory component, and apparatus containing such circuits.

In a first general aspect, the present invention presents a time cycle suppressor circuit for use with delay locked loops, said time cycle suppressor circuit comprising:

an input node for receiving an input signal; an inverter circuit, said inverter circuit operationally coupled to said input node for providing a complement to said input signal; a first latch circuit, said first latch circuit having an input for receiving said input signal, a reset input for resetting said first latch circuit, a data input operationally connected to a voltage source, and a first output signal; a second latch circuit, said second latch circuit having an input for receiving said complement to said input signal, a reset input for resetting said second latch circuit, a data input operationally connected to said first output signal, and a second output signal; a first AND gate having a first input and a second input, wherein said first input is operationally connected to said first output signal, and said second input is operationally connected to said second output signal, said first AND gate having a third output signal; a second AND gate having a first input and a second input, wherein said first input is operationally connected to said third output signal, and said second input is operationally connected to said complement to said input signal, said second AND gate having a fourth output signal; and an output node for outputting said fourth output signal.

In a second general aspect, the present invention presents a method for conditioning with time cycle suppressor circuit, for use with delay locked loops, said method comprising: providing an input node for receiving an input signal; providing an inverter circuit, said inverter circuit operationally coupled to said input node for providing a complement to said input signal; providing a first latch circuit, said first latch circuit having an input for receiving said input signal, a reset input for resetting said first latch circuit, a data input operationally connected to a voltage source, and a first output signal; providing a second latch circuit, said second latch circuit having an input for receiving said complement to said input signal, a reset input for resetting said second latch circuit, a data input operationally connected to said first output signal, and a second output signal; providing a first AND gate having a first input and a second input, wherein said first input is operationally connected to said first output signal, and said second input is operationally connected to said second output signal, said first AND gate having a third output signal; providing a second AND gate having a first input and a second input, wherein said first input is operationally connected to said third output signal, and said second input is operationally connected to said complement to said input signal, said second AND gate having a fourth output signal; and providing an output node for outputting said fourth output signal.

In a third general aspect, the present invention presents a DLL circuit architecture for reducing lock time in said DLL, said DLL circuit architecture comprising: an input node for receiving an input signal, wherein said input signal is a reference clock signal having a period; a time cycle suppressor circuit, said time cycle suppressor circuit operationally coupled to said input node; a phase frequency detector circuit operationally coupled to said time cycle suppressor circuit; a charge pump circuit operationally coupled to said phase frequency detector circuit; a coarse delay tuner circuit, said coarse delay tuner circuit operationally coupled to said input node; a fine delay tuner circuit, said fine delay tuner circuit operationally coupled to said coarse delay tuner circuit and to said phase frequency detector; and an output node operationally coupled to said fine delay tuner circuit, for outputting a fine delay output signal.

In a fourth general aspect, the present invention presents a method for reducing lock time in a delay locked loop (DLL), said method comprising: providing an input node for receiving an input signal, wherein said input signal is a reference clock signal having a period; providing a time cycle suppressor circuit, said time cycle suppressor circuit operationally coupled to said input node; providing a phase frequency detector circuit operationally coupled to said time cycle suppressor circuit; providing a charge pump circuit operationally coupled to said phase frequency detector circuit; providing a coarse delay tuner circuit, said coarse delay tuner circuit operationally coupled to said input node; providing a fine delay tuner circuit, said fine delay tuner circuit operationally coupled to said coarse delay tuner circuit and to said phase frequency detector; and providing an output node operationally coupled to said fine delay tuner circuit, for outputting a fine delay output signal.

In a fifth general aspect, the present invention presents an semiconductor device with a synchronous memory component utilizing a DLL, said semiconductor device comprising: a reference clock signal applied to said synchronous memory device at an input node; a time cycle suppressor circuit, said time cycle suppressor circuit operationally coupled to said input node; a phase frequency detector circuit operationally coupled to said time cycle suppressor circuit; a charge pump circuit operationally coupled to said phase frequency detector circuit; a coarse delay tuner circuit, said coarse delay tuner circuit operationally coupled to said input node; a fine delay tuner circuit, said fine delay tuner circuit operationally coupled to said coarse delay tuner circuit and to said phase frequency detector; and an output node operationally coupled to said fine delay tuner circuit, for outputting a fine delay output signal.

In a sixth general aspect, the present invention presents a method for reducing lock time in a delay locked loop (DLL) in a semiconductor device with a synchronous memory component utilizing a DLL, said method comprising: providing an input node for receiving an input signal, wherein said input signal is a reference clock signal having a period; providing a time cycle suppressor circuit, said time cycle suppressor circuit operationally coupled to said input node; providing a phase frequency detector circuit operationally coupled to said time cycle suppressor circuit; providing a charge pump circuit operationally coupled to said phase frequency detector circuit; providing a coarse delay tuner circuit, said coarse delay tuner circuit operationally coupled to said input node; providing a fine delay tuner circuit, said fine delay tuner circuit operationally coupled to said coarse delay tuner circuit and to said phase frequency detector; and providing an output node operationally coupled to said fine delay tuner circuit, for outputting a fine delay output signal.

In a seventh general aspect, the present invention presents an apparatus containing a synchronous integrated circuit, said apparatus comprising: a synchronous memory component; a reference clock signal applied to said synchronous memory component; and a delay locked loop, wherein said delay locked loop includes circuit architecture for reducing lock time in said synchronous memory component, said circuit architecture further comprising: an input node for receiving an input signal, wherein said input signal is a reference clock signal having a period; a time cycle suppressor circuit, said time cycle suppressor circuit operationally coupled to said input node; a phase frequency detector circuit operationally coupled to said time cycle suppressor circuit; a charge pump circuit operationally coupled to said phase frequency detector circuit; a coarse delay tuner circuit, said coarse delay tuner circuit operationally coupled to said input node; a fine delay tuner circuit, said fine delay tuner circuit operationally coupled to said coarse delay tuner circuit and to said phase frequency detector; and an output node operationally coupled to said fine delay tuner circuit, for outputting a fine delay output signal.

The foregoing and other features and advantages of the invention will be apparent from the following more particular description of embodiments of the invention. It is to be understood that both the foregoing general description and the following detailed description are exemplary, but are not restrictive, of the invention.

The features and inventive aspects of the present invention will become more apparent upon reading the following detailed description, claims and drawings, of which the following is a brief description.

The following is a detailed explanation of the structure and method for a delay locked loop (DLL) having a low lock time and employing a time cycle suppressor logic circuit, according to the present invention. It should be noted that the same reference numbers are assigned to components having approximately the same functions and structural features in the following explanation and the attached drawings to preclude the necessity for repeated explanation thereof.

Many digital systems rely on accurate clocks to synchronize the timing of operations and data transfers. A crystal oscillator is often used to generate a reference clock signal at some base frequency. This clock signal is then divided or multiplied to create one or more clock signals with desired frequencies. Alternatively, external clock signals can be received and likewise divided or multiplied to produce internal clocks. Delay locked loops (DLLs) and phase locked loops (PLLs) have become mandatory in these synchronous integrated circuits (ICs) to prevent clock skew, that is, the comparative difference between the phase and frequency of a reference clock signal, when compared with the phase and frequency of a feedback clock signal. When the difference between the phase and frequency is essentially zero, or within some specified tolerance, a "lock" is achieved. Minimizing the time required to achieve this DLL lock, i.e., the lock time, is an increasingly challenging proposition, particularly with DLLs in deep sub-micron integrated circuit chips. DLLs may also employ coarse delay tuner circuits to achieve low lock times of around 400 ns.

The principles of operation of a DLL which are particularly relevant to the present invention are as follows. When a periodic input signal is delayed by an integer multiple of the Input Time Period (T), the phase shift is considered zero. A DLL can then lock with a total delay of nT, where n is the number of inverters used in the DLL circuit. The circuit architecture disclosed herein provides a DLL circuit by which the lock time can be reduced. The DLL circuit architecture of the present invention can achieve low lock times of less than about 150 ns (nanoseconds).

The instant invention disclosure proposes an additional method of still further reducing DLL lock time by including a Time Cycle Suppressor logic circuit in the DLL circuit architecture along with a coarse delay tuner circuit.

Figure 1:
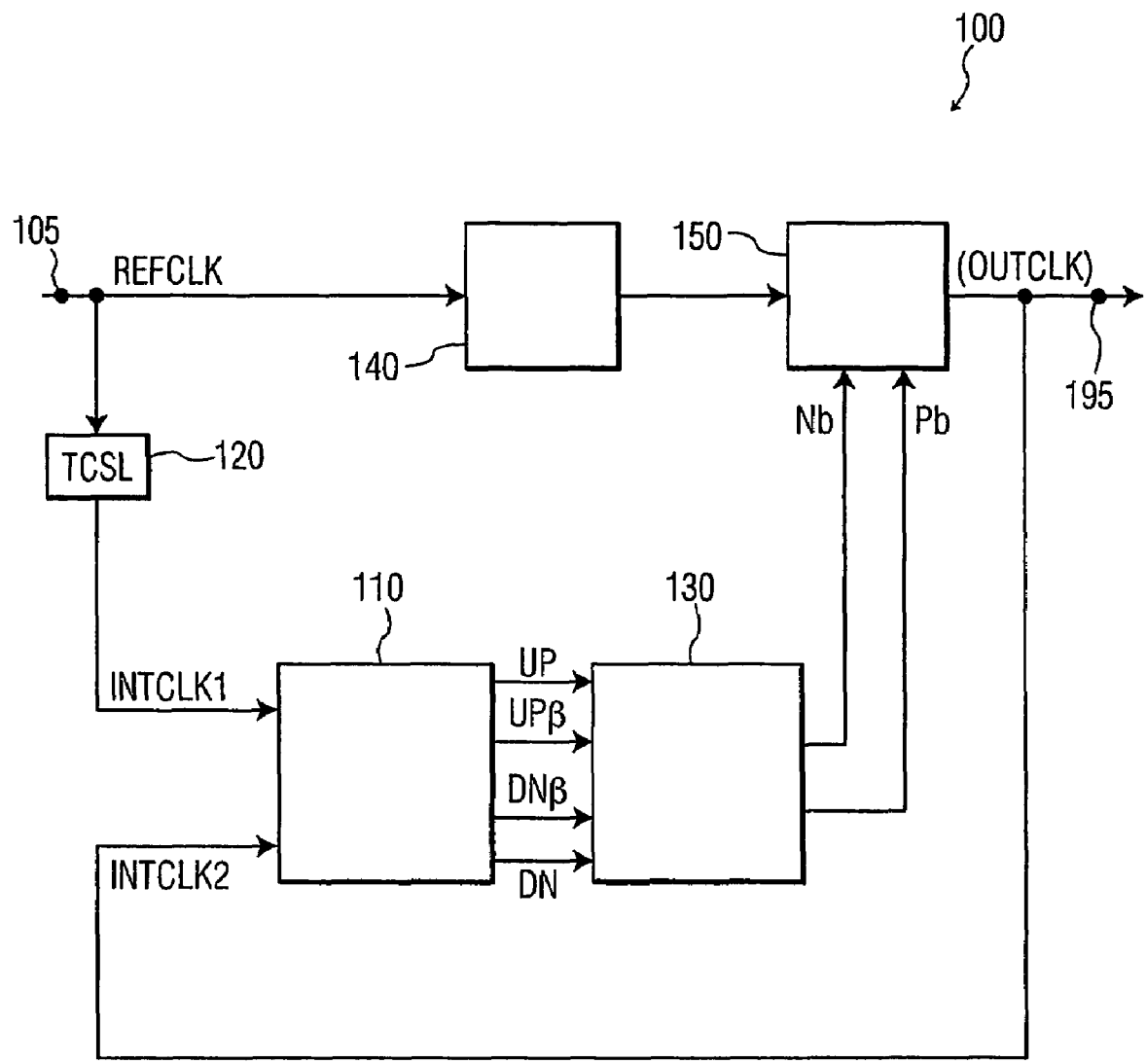
FIG. 1 is a block diagram of the delay locked loop architecture in accordance with an embodiment of the present invention.

The proposed DLL circuit architecture is represented in FIG. 1. The DLL circuit 100 includes, inter alia, the following circuit blocks: Phase Frequency Detector (PFD) 110, Time Cycle Suppressor Logic (TCSL) 120, Charge Pump and Low Pass Filter with Initialization Circuit 130, Coarse Delay Tuner with Edge Suppressor 140, and Fine Delay Tuner 150. Optionally, a buffer circuit block (not shown) may be included between output node 195 and Phase Frequency Detector 110 to provide signal conditioning of the INTCLK2 signal.

Figure 8:
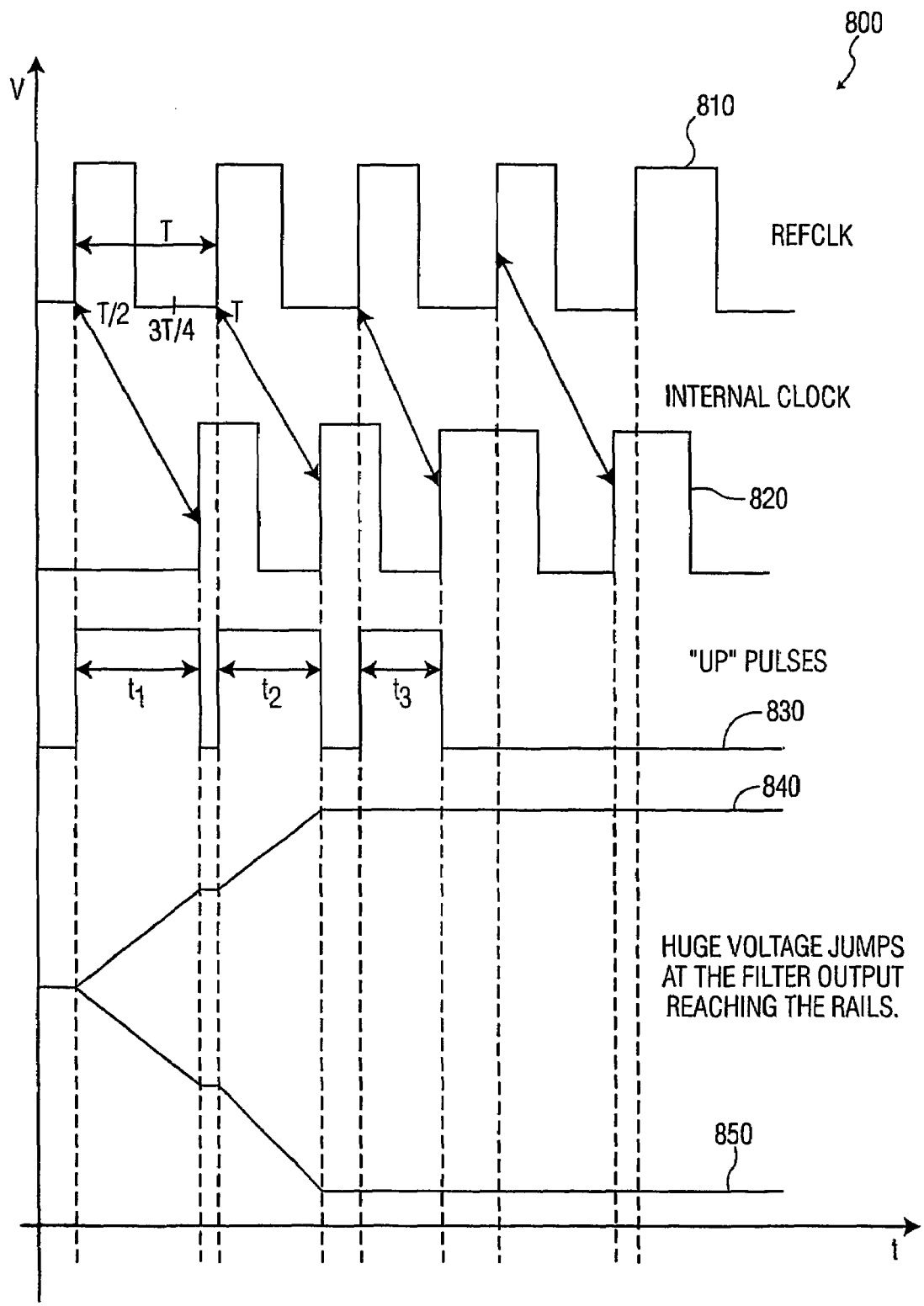
FIG. 8 is a timing diagram of a typical time cycle suppressor circuit.

In existing DLLs, the reference clock signal (REFCLK) is passed directly to the phase frequency detector 110. FIG. 8 illustrates a reference clock signal 810, an internal clock signal 820 which is to be synchronized with reference clock signal 810, and signal trace 830 which represents "up" pulses from the phase frequency detector 110 to the charge pump circuit 130. This arrangement results in the phase error becoming very large, as shown by the phase error signal traces 840, 850 in the timing diagram of FIG. 8. Although the error decreases, that is t3<t2<t1, the filter voltage swings to a greater degree until finally the voltage rails are reached. Thus, the fine delay tuner circuit 150 doesn't function, and the DLL fails at this juncture. The large phase error thus produced results in increased lock time, or a lock not being achieved at all.

Figure 2:
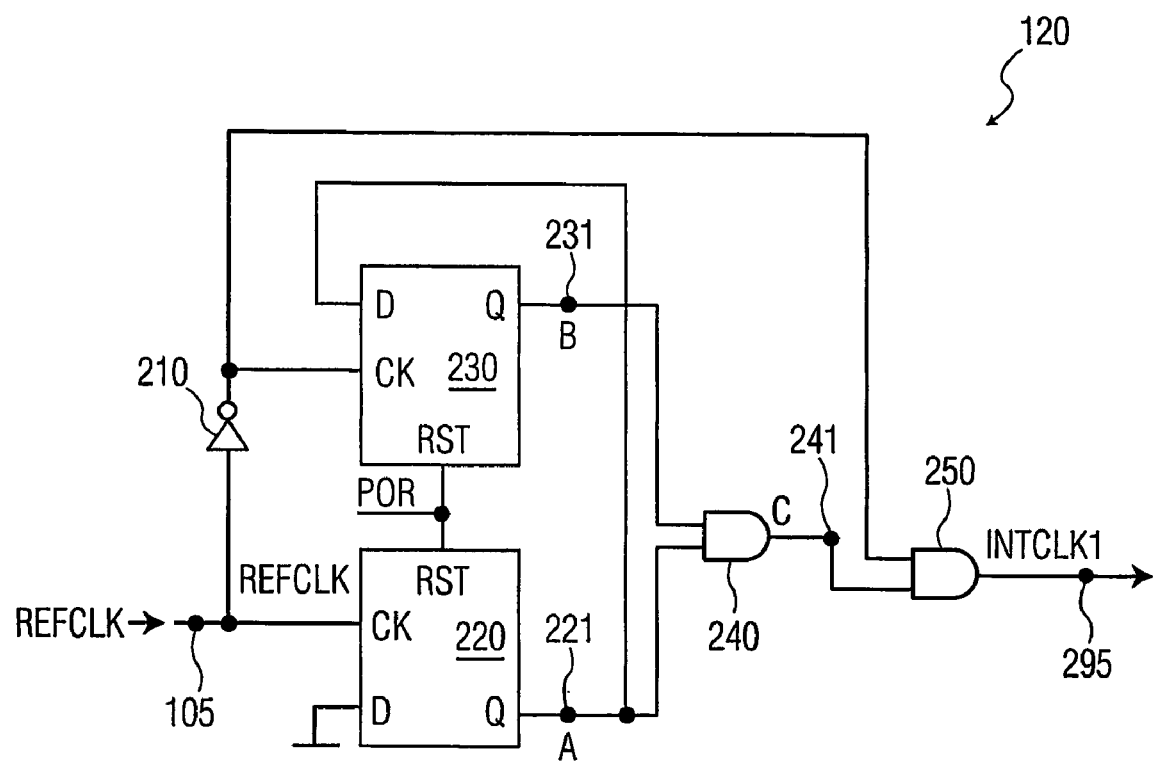
FIG. 2 is an electrical schematic diagram of a time cycle suppressor circuit in accordance with an embodiment of the present invention.
Figure 3:
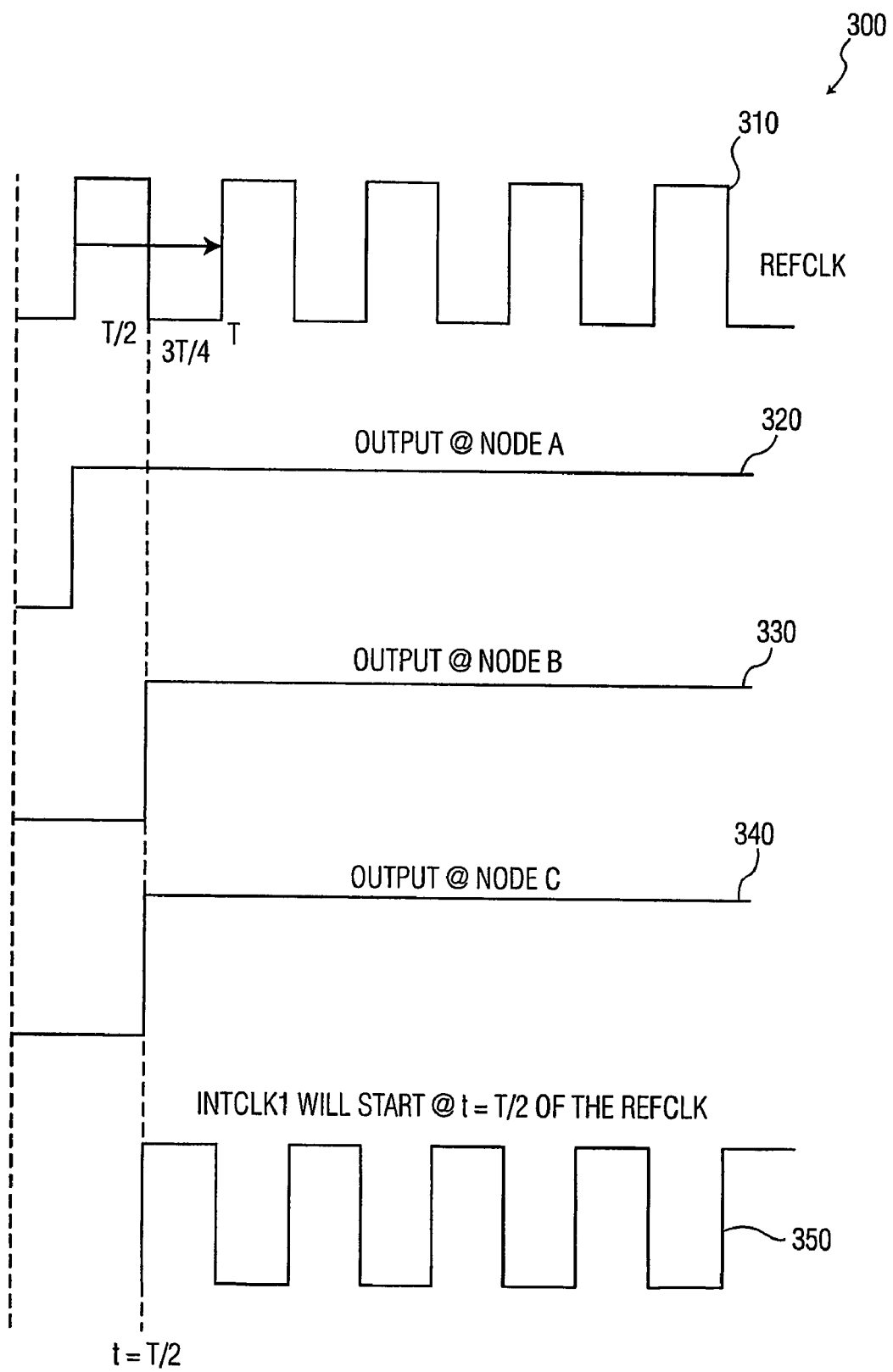
FIG. 3 is a timing diagram representing the status of various signals at different nodes of logic block in accordance with an embodiment of the present invention.

In the instant invention, instead of passing the reference clock signal (REFCLK), received at input node 105, directly to the phase frequency detector circuit 110, the REFCLK signal is passed to the time cycle suppressor logic circuit block 120, as shown in FIG. 2. The REFCLK signal is also received by the coarse delay tuner circuit 140. The output of the coarse delay tuner circuit 140 is passed to the fine delay tuner circuit 150. The output signal (OUTCLK) of the fine delay tuner circuit 150 is outputted at output node 195. OUTCLK is also provided to the phase frequency detector 110 as one input (INTCLK2) of two inputs. The second input to the phase frequency detector 110 is the output of the time cycle suppressor logic circuit block 120, which is called INTCLK1. Phase frequency detector 110 supplies four outputs, UP, UPB, DN, DNB to the charge pump and low pass filter with initialization circuit 130. Charge pump and low pass filter with initialization circuit 130 in turns supplies two signals Nb, Pb to fine delay tuner circuit 150. The REFCLK signal emerges from the time cycle suppressor logic circuit block 120 as the INTCLK1 signal. The INTCLK1 signal has its first rising edge at time t=T/2 of the REFCLK signal, where T represents the period of the REFCLK signal. This is shown in the timing diagram of FIG. 3 by representative signal traces 310 (REFCLK) and 350 (INTCLK1).

In a first exemplary embodiment having a 66 MHz REFCLK signal, the INTCLK1 signal will have its first rising edge at approximately 7.5 ns of the period 15.0 ns of the REFCLK signal. Similarly, in a second exemplary embodiment having a 100 MHZ REFCLK signal, the INTCLK1 signal will have its first rising edge at approximately 5 ns. And in a third exemplary embodiment having a 133 MHZ REFCLK signal, the INTCLK1 signal will have its first rising edge at approximately 3.75 ns.

An exemplary embodiment of the time cycle suppressor logic circuit block 120, of FIG. 1, is represented by the electrical schematic of FIG. 2. The time cycle suppressor logic circuit block 120 generates the INTCLK1 signal. The time cycle suppressor logic circuit block 120 comprises D-flipflops 220, 230, an inverter 210, and combinational means such as, inter alia, a pair of two-input AND gates 240, 250. The time cycle suppressor logic circuit block 120 may be constructed using CMOS transistor technology, or other suitable technologies may be employed.

The D-flipflops 220, 230 are resettable, and positive edge triggered. As is known, each D-flipflop 220, 230 comprises a data input (D), a clock input (CK), an output Q, and a reset or enable input (RST). Here, the power-on reset signal (POR) is used in resetting the outputs Q of the D-flipflops 220, 230 to zero. In operation, the outputs Q of the two positive-edge triggered D-flipflops 220, 230, respectively, are positive step signals A, B at nodes 221 and 231, respectively. Signals A and B are logically combined at AND gate 240, resulting in positive step signal C at node 241.

Step signal C is then logically combined with the inverted REFCLK signal, from inverter 210, at AND gate 250. The output node 295 of AND gate 250 outputs the INTCLK1 signal. The relative status of each of the above signals A, B, C at each node 221, 231, 241, respectively, is shown in the timing diagram of FIG. 3 by traces 320, 330, 340, respectively.

This positive step signal C at node 241, when logically ANDed with the signal from the output of inverter 210 (i.e., the complement of REFCLK), at AND gate 250, produces the output signal INTCLK1. In this illustrative example, output signal INTCLK1 has its first rising edge at time t=3T/4 of the original incoming input REFCLK signal. Thus, the time cycle suppressor logic circuit block 120 shifts the rising edge of the incoming clock signal REFCLK by 3T/4, or approximately 75% of the period T of the REFCLK signal.

Operation of the coarse delay tuner circuit 140 will now be discussed. An example of an improved coarse delay tuner circuit is provided in U.S. patent application Ser. No. 09/123,456, filed Dec. 1, 2002, entitled "Coarse Delay Tuner Circuits with Edge Suppressors in Delay Locked Loops" having a common assignee with the instant application, and which is incorporated herein by reference.

Figure 4:
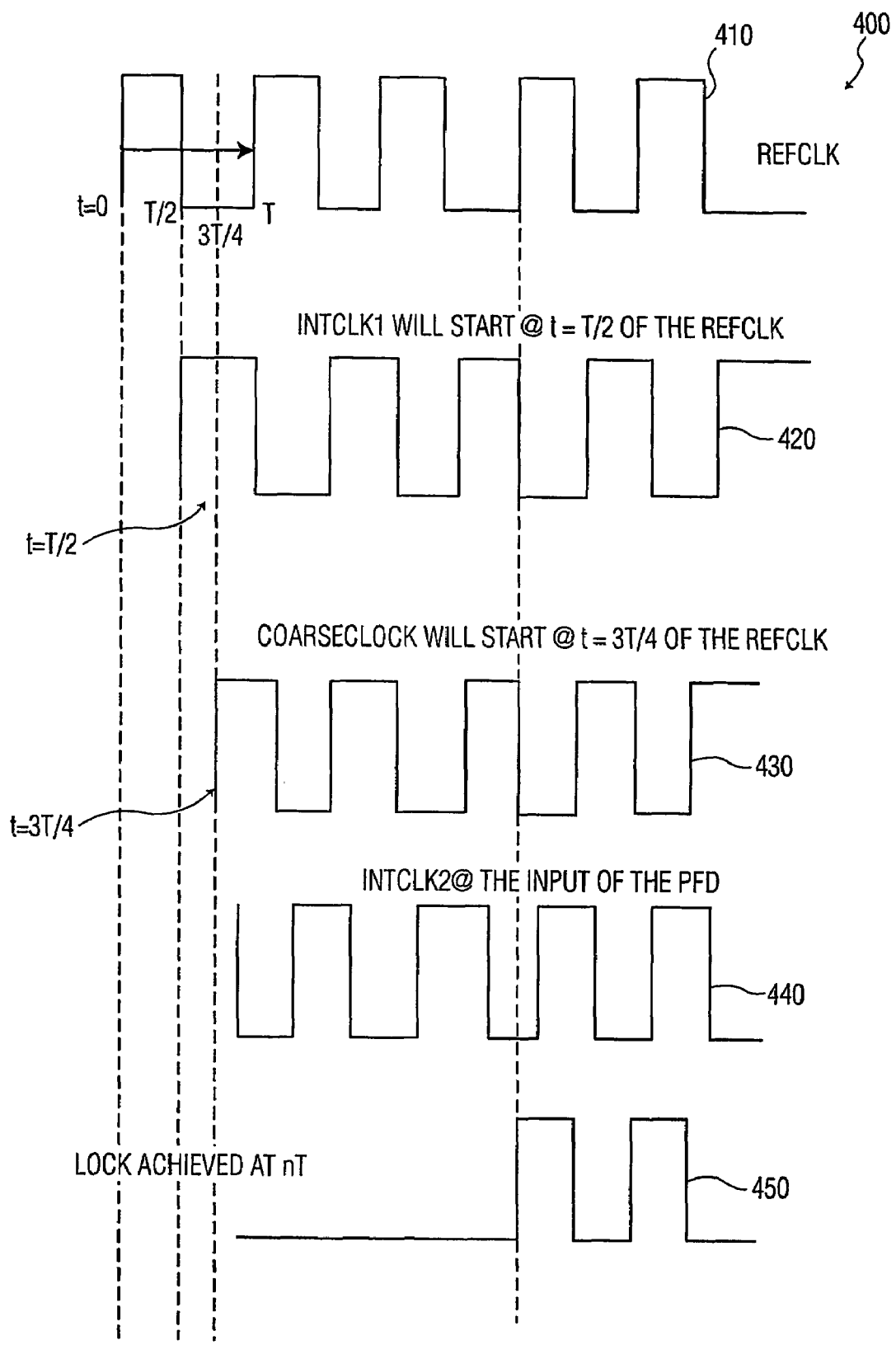
FIG. 4 is a timing diagram representing timings of various signals in the delay locked loop (DLL) block accordance with an embodiment of the present invention.

At the same instant that the REFCLK signal is passed to the time cycle suppressor circuit 120, the REFCLK signal is also passed to the coarse delay tuner circuit 140, to generate the INTCLK2 signal. The purpose of the coarse delay tuner circuit 140 is to make the INTCLK2 signal start at some fractional or delay time (e.g., t=3T/4) of the REFCLK signal. This delay reduces the phase error between the two signals INTCLK1 and INTCLK2, and also permits a faster error correction, as shown by traces 420 (INTCLK1) and 440 (INTCLK2) in the timing diagram of FIG. 4.

Figure 5:
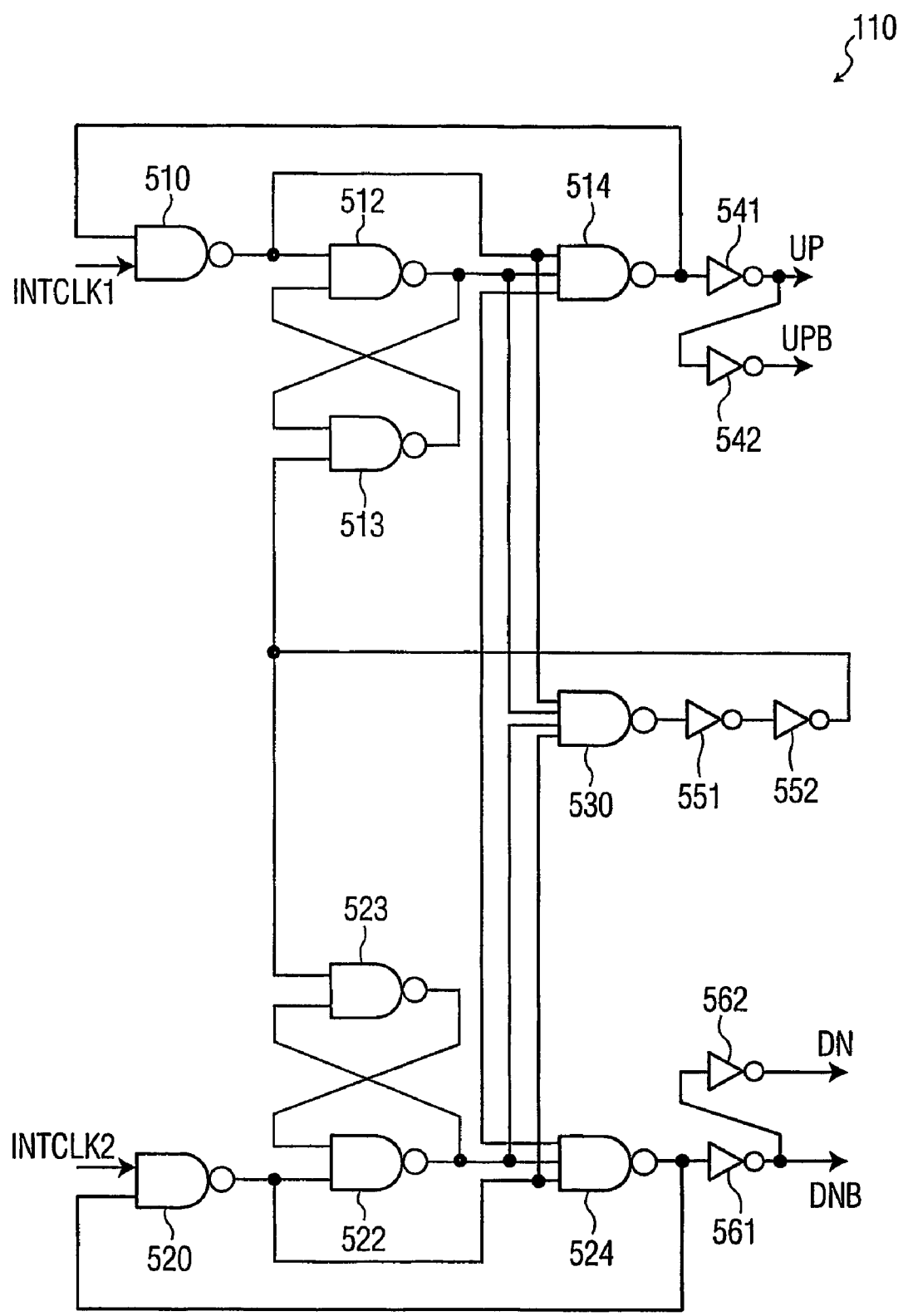
FIG. 5 is an electrical schematic diagram of a phase frequency detector in accordance with an embodiment of the present invention.

The operation of the phase frequency detector 110 will now be explained with reference to FIG. 5. In the illustrative embodiment of FIG. 5, phase frequency detector 110 is comprised of NAND gates 510, 512, 513, 514, 520, 522, 523, 524, 530 and inverting amplifiers 541, 542, 551,552, 562, 561. NAND gate 510 receives the INTCLK1 signal from the time cycle suppressor logic circuit block 120, while NAND gate 520 receives the INTCLK2 signal from output node 195 of the fine delay tuner 150 shown in FIG. 7.

Figure 6:
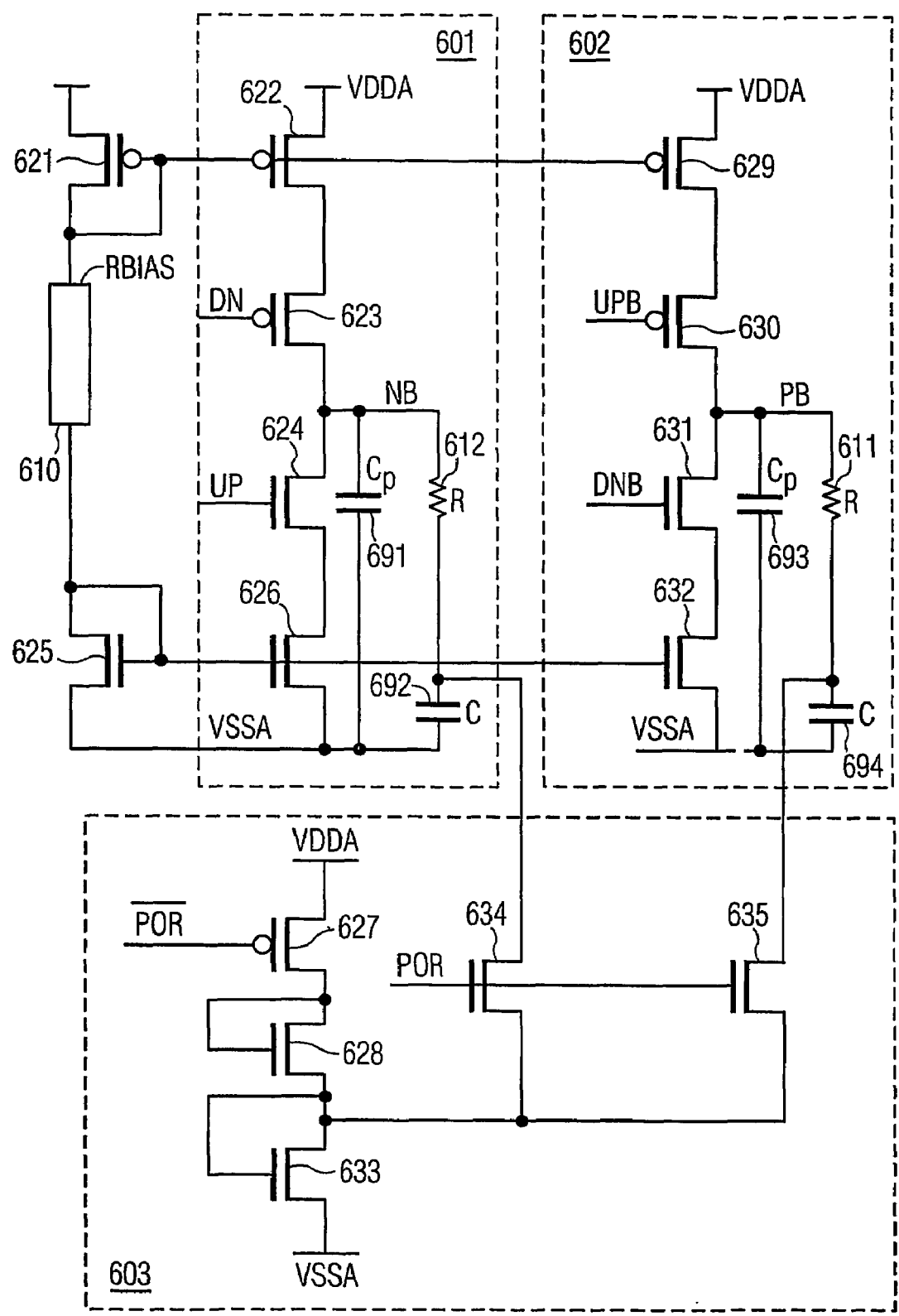
FIG. 6 is an electrical schematic of a charge pump and low pass filter with an initialization circuit in accordance with an embodiment of the present invention.

The operation of the charge pump and the low pass filter circuits, collectively shown in FIG. 1 as logic circuit block 130, will now be explained with reference to FIG. 6. The charge pump circuit of FIG. 6 employs dual arms 601, 602, as well as an initialization circuit 603. First arm 601 comprises transistors 622, 623, 624, 626, capacitors 691, 692, and resistor 612. Second arm 602 comprises transistors 629, 630, 631, 632, capacitors 693, 694, and resistor 611. Each arm 601, 602 is connected to a biasing circuit comprising transistors 621, 625 and bias resistor 610. Logic circuit block 130 receives as its inputs, four signals which are outputs from the phase frequency detector circuit 110. These four signals are called UP, DN, UPB, and DNB. Initialization circuit 603 comprises transistors 627, 628, 633, 634, 635 and is used to reset the charge pump circuit of arms 601, 602. Initialization circuit 603 is controlled by the power-on reset signal (POR) and its complement. A second-order filter is used to remove the ripples so that the control voltage to the fine tuner can be a smoother signal. Analog signals Vdda and Vssa are used for the charge pump, filter and fine tuner.

Figure 7:
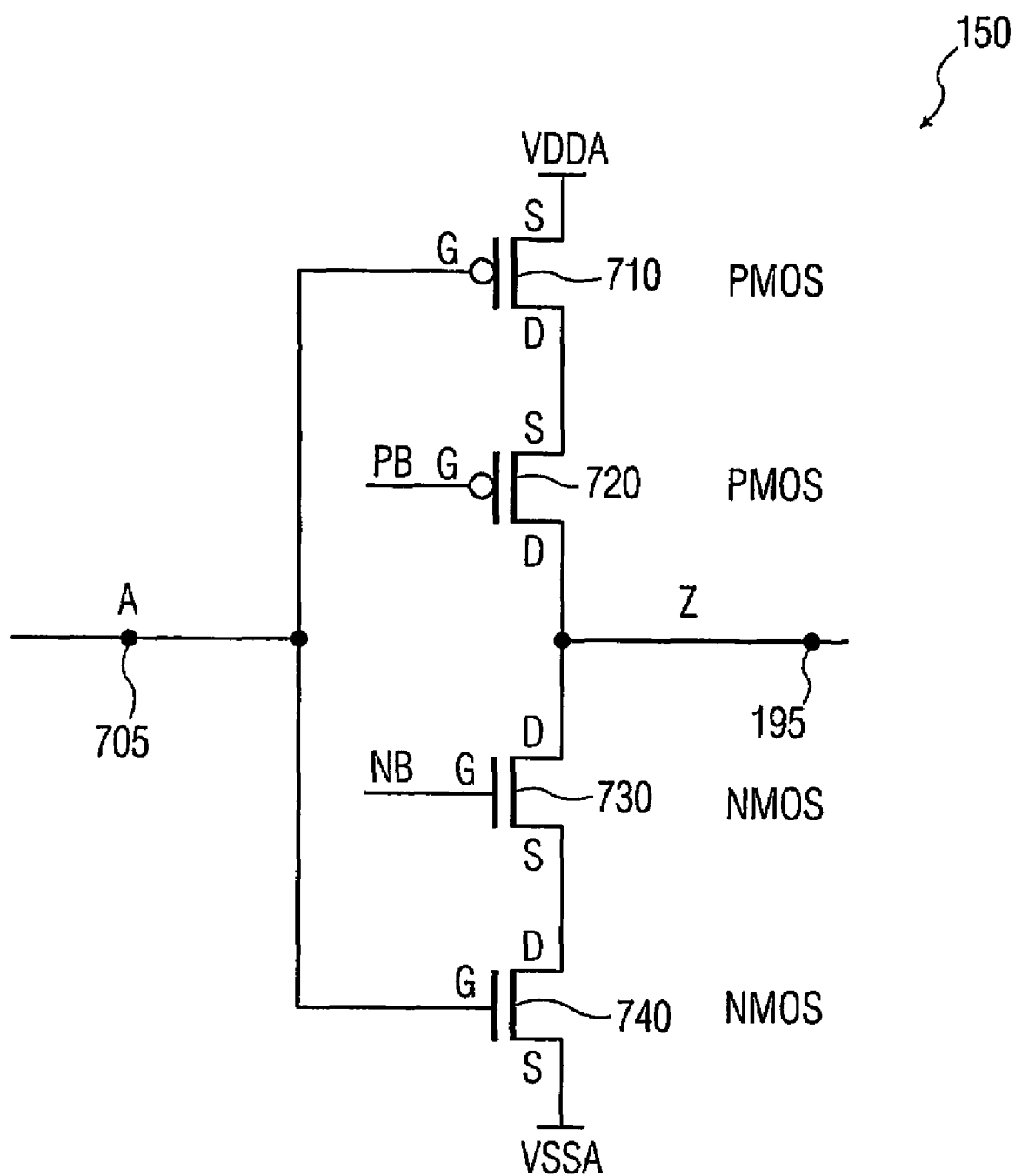
FIG. 7 is an electrical schematic of a current starved inverter for the voltage controlled delay line (VCDL) in accordance with an embodiment of the present invention.

The fine delay tuner circuit 150 is shown in FIG. 7. Fine delay tuner circuit 150 comprises input node 705 for receiving a signal A from coarse delay tuner 140, and output node 195 for outputting output signal Z. Fine delay tuner circuit 150 is constructed using complementary metal-oxide-semiconductor (CMOS) transistors further comprises PMOS transistors 710, 720, and NMOS transistors 730, 740.

Embodiments of the present invention have been disclosed. A person of ordinary skill in the art would realize, however, that certain modifications would come within the teachings of this invention. For example, rather than the particular transistor technology represented by the embodiment discussed herein regarding FIG. 2, the present invention also encompasses embodiments incorporating other transistor technologies. Similarly, inversions of the signals may be included. Therefore, the following claims should be studied to determine the true scope and content of the invention

The invention claimed is:

1. A time cycle suppressor circuit for use with delay locked loops, said time cycle suppressor circuit comprising:
   an input node for receiving an input signal;
   an inverter circuit, said inverter circuit operationally coupled to said input node for providing a complement to said input signal;
   a first latch circuit, said first latch circuit having an input for receiving said input signal, a reset input for resetting said first latch circuit, a data input operationally connected to a voltage source, and a first output signal;
   a second latch circuit, said second latch circuit having an input for receiving said complement to said input signal, a reset input for resetting said second latch circuit, a data input operationally connected to said first output signal, and a second output signal;
   a first AND gate having a first input and a second input, wherein said first input is operationally connected to said first output signal, and said second input is operationally connected to said second output signal, said first AND gate having a third output signal;
   a second AND gate having a first input and a second input, wherein said first input is operationally connected to said third output signal, and said second input is operationally connected to said complement to said input signal, said second AND gate having a fourth output signal; and
   an output node for outputting said fourth output signal.

2. The time cycle suppressor circuit of claim 1, wherein said first latch circuit and said second latch circuit are D-flipflops.

3. The time cycle suppressor circuit of claim 2, wherein said input signal is a reference clock signal.

4. The time cycle suppressor circuit of claim 3, wherein said reference clock signal has a period T.

5. The time cycle suppressor circuit of claim 4, wherein said fourth output signal begins at a time, wherein said time is a fraction of the period T of the reference clock signal.

6. The time cycle suppressor circuit of claim 5, wherein said fourth output signal begins at a time approximately equal to T/2.

7. A method for conditioning with a time cycle suppressor circuit, for use with delay locked loops, said method comprising:
   providing an input node for receiving an input signal;
   providing an inverter circuit, said inverter circuit operationally coupled to said input node for providing a complement to said input signal;
   providing a first latch circuit, said first latch circuit having an input for receiving said input signal, a reset input for resetting said first latch circuit, a data input operationally connected to a voltage source, and a first output signal;
   providing a second latch circuit, said second latch circuit having an input for receiving said complement to said input signal, a reset input for resetting said second latch circuit, a data input operationally connected to said first output signal, and a second output signal;
   providing a first AND gate having a first input and a second input, wherein said first input is operationally connected to said first output signal, and said second input is operationally connected to said second output signal, said first AND gate having a third output signal;
   providing a second AND gate having a first input and a second input, wherein said first input is operationally connected to said third output signal, and said second input is operationally connected to said complement to said input signal, said second AND gate having a fourth output signal; and
   providing an output node for outputting said fourth output signal.

8. The time cycle suppressor circuit of claim 7, wherein said first latch circuit and said second latch circuit are D-flipflops.

9. The time cycle suppressor circuit of claim 8, wherein said input signal is a reference clock signal.

10. The time cycle suppressor circuit of claim 9, wherein said reference clock signal has a period T.

11. The time cycle suppressor circuit of claim 10, wherein said fourth output signal begins at a time, wherein said time is a fraction of the period T of the reference clock signal.

12. The time cycle suppressor circuit of claim 11, wherein said fourth output signal begins at a time approximately equal to T/2.

* * * * *